United States Patent
Belady et al.

(10) Patent No.: US 6,825,651 B2
(45) Date of Patent: Nov. 30, 2004

(54) TEST METHOD FOR CHARACTERIZING CURRENTS ASSOCIATED WITH POWERED COMPONENTS IN AN ELECTRONIC SYSTEM

(75) Inventors: Christian L. Belady, McKinney, TX (US); Stuart C. Haden, Lucas, TX (US); Paul A. Wirtzberger, Greenville, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/121,356

(22) Filed: Apr. 12, 2002

(65) Prior Publication Data

US 2003/0193326 A1 Oct. 16, 2003

(51) Int. Cl.[7] .................................................. G01R 1/14
(52) U.S. Cl. ....................................................... 324/127
(58) Field of Search ........................ 324/127, 537–538, 324/760, 763, 96, 117 H, 750

(56) References Cited

U.S. PATENT DOCUMENTS

| | | | | |
|---|---|---|---|---|
| 5,469,064 A | * | 11/1995 | Kerschner et al. | 324/537 |
| 5,489,851 A | * | 2/1996 | Heumann et al. | 324/537 |
| 5,946,546 A | * | 8/1999 | Fillion et al. | 438/15 |
| 6,087,842 A | * | 7/2000 | Parker et al. | 324/763 |
| 6,097,203 A | * | 8/2000 | Parker et al. | 324/538 |
| 6,112,156 A | * | 8/2000 | Kang | 702/58 |
| 6,259,249 B1 | * | 7/2001 | Miyata | 324/207.17 |
| 6,340,952 B1 | * | 1/2002 | Tsai et al. | 343/741 |
| 6,504,392 B2 | * | 1/2003 | Fredeman et al. | 324/760 |

FOREIGN PATENT DOCUMENTS

JP          2000099551 A   *   4/2000   ............. G01R/31/28

* cited by examiner

Primary Examiner—Michael Tokar
Assistant Examiner—Jermele Hollington

(57) ABSTRACT

A test method characterizes current behavior of power components (e.g., semiconductor packages) within an electronic system. One or more electrically conductive loops are formed with a first printed circuit board of the electronic system; these loops surround, at least in part, one or more electrical vias of the first printed circuit board. One or more power components connect to the vias to obtain power therethrough. Current characteristics are measured from one or more vias to assess transient and steady-state currents of components within the system. Power dissipation may be determined from the current. The loops may be formed within tracks of internal layers of the first printed circuit board, or a second printed circuit board may form the tracks.

23 Claims, 3 Drawing Sheets

TEST METHOD FOR CHARACTERIZING CURRENTS ASSOCIATED WITH POWERED COMPONENTS IN AN ELECTRONIC SYSTEM

BACKGROUND OF THE INVENTION

Current draw characterizations of semiconductor power components (e.g., a semiconductor die) within electronic systems have always been difficult to determine. Such characterizations are however needed to appropriately design cooling and power solutions in the system design. By way of example, electronic systems often include thermal dissipation elements, such as heat sinks, to counter heat-generating components such as power supplies and microprocessors. To ensure proper thermal dissipation, the design of the system's heat dissipation capacity is often made to over-compensate uncertainties in power consumption and dissipation relative to the heat-generating components. In one example, a power supply may be rated to a specified power dissipation; however this rating may not represent the actual performance of the supply in operation within the system. In another example, electronic system designers sometimes take temperature measurements of prototype devices and then perform calculations to predict future thermal loads within production systems; however, this technique also does not provide actual performance accuracy during operation because the power characterizations for individual components are not accurately known. Moreover, in this latter example, temperature measurements may be made for several components within the electronic system, causing cumulative errors in the thermal dissipation and power consumption estimates.

Accordingly, electronic systems are designed with certain thermal dissipation over-capacity to account for actual heat generation within the systems. Likewise, such systems are designed with certain power supply over-capacity to account for current draw and power variations for individual components of the systems. These over-capacities represent an increased cost of manufacture, such as the production cost for the heat sinks and power distribution components within the electronic system; in the world of highly competitive electronic computers and components, increased costs may make the underlying product uncompetitive.

The invention provides techniques and methods for improving estimation and measurement of transient and steady-state current draw for components within electronic systems. One feature of the invention is to provide methods for designing power and/or cooling solutions for electronic systems. Other features of the invention will be apparent within the description that follows.

SUMMARY OF THE INVENTION

The invention of one aspect is a method for characterizing current of power components within electronic systems. In one aspect, the method includes characterizing steady-state and/or transient current for the power components coupled with AC and/or DC power. In another aspect, the method includes characterizing current behavior for a single power component within an electronic system that connects to a ground and/or power plane; the system may also have a plurality of other power components connected to the ground and/or power plane.

Accordingly, one method of the invention provides the following steps. An electrical loop path is formed with a first printed circuit board to surround, at least in part, an electrical via of the first printed circuit board. The via connects to ground or a power plane. A power component operable with the first printed circuit board is connected to the via, to obtain power or to couple the component to ground. The power may be AC or DC power supplied to the power plane. The loop is coupled to an ammeter, or other current measurement device, to measure and/or characterize current during powered operation of the component. The current is used to specify cooling and/or power supply solutions for the electronic system utilizing the first printed circuit board and component.

In one aspect, the via connects to the ground plane of the first printed circuit board. In another aspect, the via connects to the power plane of the first printed circuit board. In another aspect, the loop is constructed and arranged as an internal track of the first printed circuit board. In still another aspect, the loop is formed with second printed circuit board that temporarily fits between the component and the first printed circuit board.

In another aspect, therefore, the method provides for determining power dissipation requirements for a heat sink used to dissipate heat from the component within the electronic system.

In another aspect, therefore, the method provides for determining power supply requirements for the component within the electronic system, the supply being capable of responding to step-load characterizations associated with the current draw of the component within the system.

In one aspect, the step of specifying power dissipation includes using via current (I) in a step of calculating power dissipation of the component as substantially equal to VI, V being the voltage potential between the ground and power planes.

In another aspect, a method is provided for determining current characterizations of power components in electronic system. A plurality of electrical loops are arranged to surround, at least in part, a plurality of vias of the system. In one aspect, one or more vias couple to ground of the electronic system. In another aspect, one or more vias couple to a power plane of the system. A plurality of power components operable with the system connect to ground and/or power through the vias. The loops are coupled to a measuring device to measure current and/or voltage of the power components during powered operation of the system. In one aspect, the currents from the power components are converted to estimated power dissipation of the system. In one aspect, the currents from the power components are converted to estimated transient current for the power components of the system. In still another aspect, the currents from the power components are converted to estimated steady-state current for the power components of the system.

In another aspect, the method provides for converting currents to an estimated power dissipation by calculating power for each of the components as substantially equal to VI, where V is the voltage between the ground and power planes and I is the current through the via. In still another aspect, the method includes the step of designing a heat sink to accommodate the estimated power dissipation.

In another aspect, the plurality of loops are constructed and arranged with the system as a statistical sampling of the vias. The method may further include the step of estimating (a) total power dissipation, (b) transient current draw, and/or (c) steady-state currents of all powered components in the system based on the statistical sampling.

In yet another aspect, the electrical system includes a first printed circuit board. The loops are constructed and arranged as tracks within the first printed circuit board. In yet another aspect, the loops are constructed and arranged within a second printed circuit board; the second circuit board is temporarily coupled between the power components and the first printed circuit board to estimate currents and/or power dissipation.

The invention of another aspect includes a test method for characterizing current of one or more power components of an electronic system. The power components connect to a printed circuit board via a plurality of pins; at least one of the pins for each of the components also connects to system power through one or more of the vias within the printed circuit board. An electrical loop is formed about one or more of the vias to characterize current associated therewith. The characterized current is used to assess current and/or power associated with the power components. In one aspect, transient current is determined from the characterized current. In another aspect, steady-state current is determined from the characterized current.

The invention is next described further in connection with preferred embodiments, and it will become apparent that various additions, subtractions, and modifications can be made by those skilled in the art without departing from the scope of the invention.

BRIEF DESCRIPTION OF THE DRAWINGS

A more complete understanding of the invention may be obtained by reference to the drawings, in which.

DETAILED DESCRIPTION OF THE DRAWINGS

Figure 1:
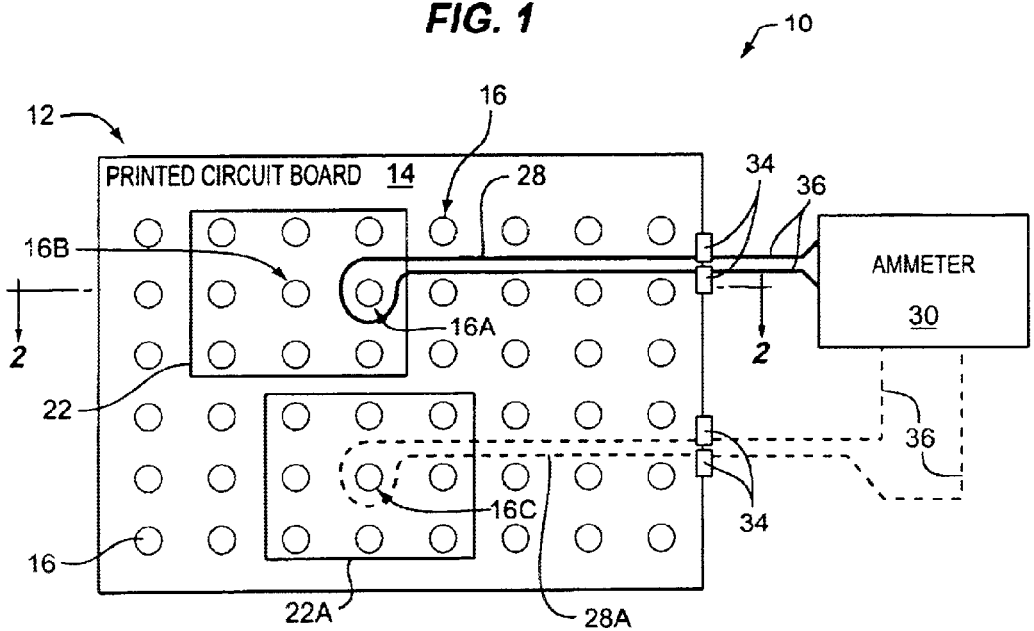
FIG. 1 shows a top view of one current estimation system of the invention.
Figure 2:
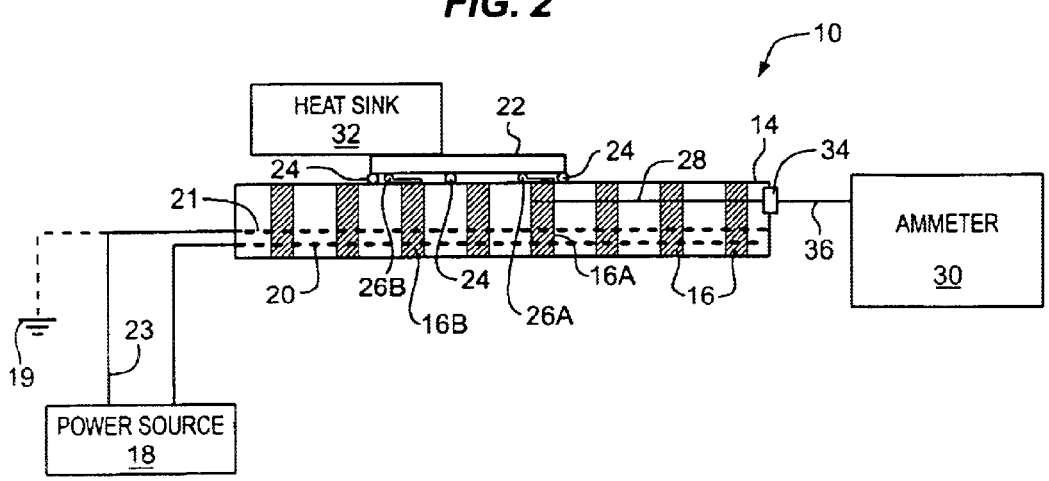
FIG. 2 shows a cross-sectional side view of the current estimation system of FIG. 1 and coupled to a power component.

FIG. 1 shows a top view of one current estimation device 10 of the invention; FIG. 2 shows a cross-sectional side view of device 10, and additionally coupled with a heat sink 32. Device 10 couples with an electronic system 12 including a printed circuit board 14. Printed circuit board 14 has a plurality of vias 16. Certain vias 16 connect to a ground plane 21; certain other vias 16 connect to a power plane 20. A power source 18 connects to power plane 20 to provide system power. Power source 18 may further connect to ground plane 21, as shown; and, though not required, ground plane 21 may further connect to a system ground 19. A power component 22 (shown as a transparent outline in FIG. 1, for purposes of illustration) couples with printed circuit board 14 and operates by obtaining power and ground through vias 16. By way of example, power component 22 may be a semiconductor die and package attached to circuit board 14 by conductive solder joints or sockets 24. One or more pins of component 22 may further connect to system power source 18 by a conductive connection 26A with an appropriate via 16A, which in turn connects with power plane 20 as shown. One or more pins of component 22 also may connect to ground (e.g., system ground 19 and/or other terminal 23 of power source 18) by a conductive connection 26B with an appropriate via 16B, which in turn connects with ground plane 21 as shown. Connections 26A, 26B may be solder or socket connections known in the art.

Device 10 also includes at least one electrically conductive loop 28 that surrounds, at least in part, at least one relevant via 16A, 16B; for purposes of illustration, loop 28 is shown to surround via 16A. One or more additional electrically conductive loops 28A may surround a like number of additional vias 16C, such as shown; the additional loops 28A are typically included with device 10 to accommodate additional power components 22A or additional power and/or ground vias 16. A power component 22 may have multiple connections to the ground and power planes 21, 20 in order to ensure appropriate current capacity.

In operation, device 10 characterizes current behavior of component 22 by measuring the current through loop 28. By way of example, transient and/or steady-state current behavior of the associated via 16A may be determined from the measured current. Voltage behavior may also be assessed. Accordingly, a measuring device such as an ammeter 30 couples with loop 28 to assess current behavior. The measured behavior may be converted to power dissipation by a conversion equation VI, where I is the current in via 16A and V is the voltage between ground and power planes 21, 20.

When device 10 includes additional electrical loops 28A, a collective power and/or current behavior of system 12 may be determined, including the contributions of all components 22, 22A; in such an event, a common or separate measurement device 30 may be used for the several components 22, 22A.

Once power dissipation for one or more components 22 is known, by device 10, this data may be used to design an accurate thermal dissipation device, such as a heat sink 32, to cool power component 22.

Electrically conductive loops 28, 28A may be embedded and internal with printed circuit board 14, as shown in FIG. 2. By way of example, loops 28, 28A may be integral to an internal layer 29 of a multi-layer board 14. Probe connections 34 connected with electrical leads 36 may additionally couple loops 28, 28A to ammeter 30, as a matter of design choice. Accordingly, in one embodiment of the invention, device 10 includes (a) one or more loops 28 in the form of internal tracks of a multi-layer printed circuit board 14, (b) and a current monitoring device 30 couples to the loop tracks via one or more electrical connections 34, 36.

Those skilled in the art should appreciate that additional loops 28 and components 22 may be included with device 10 and system 12, respectively, without departing from the scope of the invention. It is not necessary in this instance that all vias (e.g., vias 16A, 16B, 16C) be monitored for current. Rather, a sampling of fewer vias 16 may be used to estimate transient current and/or steady-state currents for multiple components 22.

Similarly, certain components 22 may be multi-pin semiconductor packages or other components with multiple via connections to ground 19 and power source 18. Although each via may be monitored with a loop 28, such as described above, a sampling of one or more power connections to the component may suffice to estimate the total power dissipation of the multi-pin component.

Figure 3:
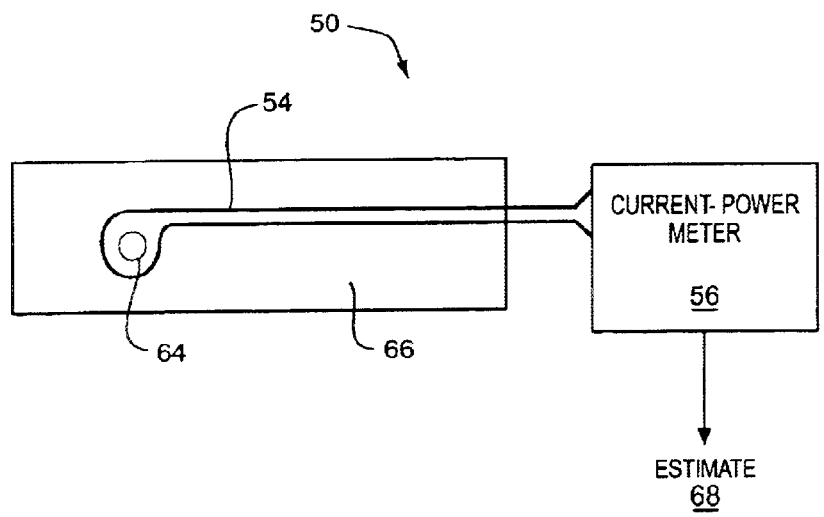
FIG. 3 shows a cross-sectional side view of one current estimation system of the invention.
Figure 4:
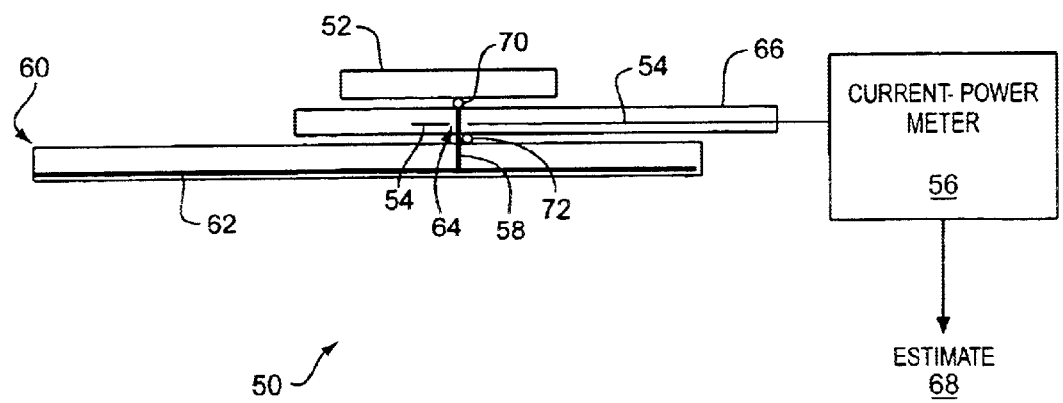
FIG. 4 shows a cross-sectional side view of the current estimation system of FIG. 3 when coupled for current measurement of a power component.

FIG. 3 shows a top view of one current estimation system 50 of the invention; FIG. 4 shows a cross-sectional side view of current estimation system 50 when coupled for measurement of a power component 52. System 50 has at least one electrically conductive loop 54 connected with a current-power monitor 56 to monitor current associated with one or more corresponding vias 58 of a printed circuit board 60. Component 52 is for example a semiconductor package or other power-dissipating device that draws power from an electrical plane 62 of printed circuit board 60. Electrical plane 62 may be a ground or power plane, such as described above. Current estimation system 50 has an electrical connector 64 to provide electrical connection between component 52 and via 58; the extension 66 of system 50 may for example be a three-layer printed circuit board with an internal track forming electrically conductive loop 54. In operation, current-power monitor 56 measures current via loop 54 and converts to estimate 68. Estimate 68 may for example permit accurate design of a heat sink for use in dissipating thermal energy from component 52. Estimate 68 may further include transient and/or steady-state current behavior of component 52. As a matter of design choice, extension 66 may couple to component 52 by one or more solder connections or sockets 70. Similarly, component 52 may couple to circuit board 60 by one or more solder connections or sockets 72.

Figure 5:
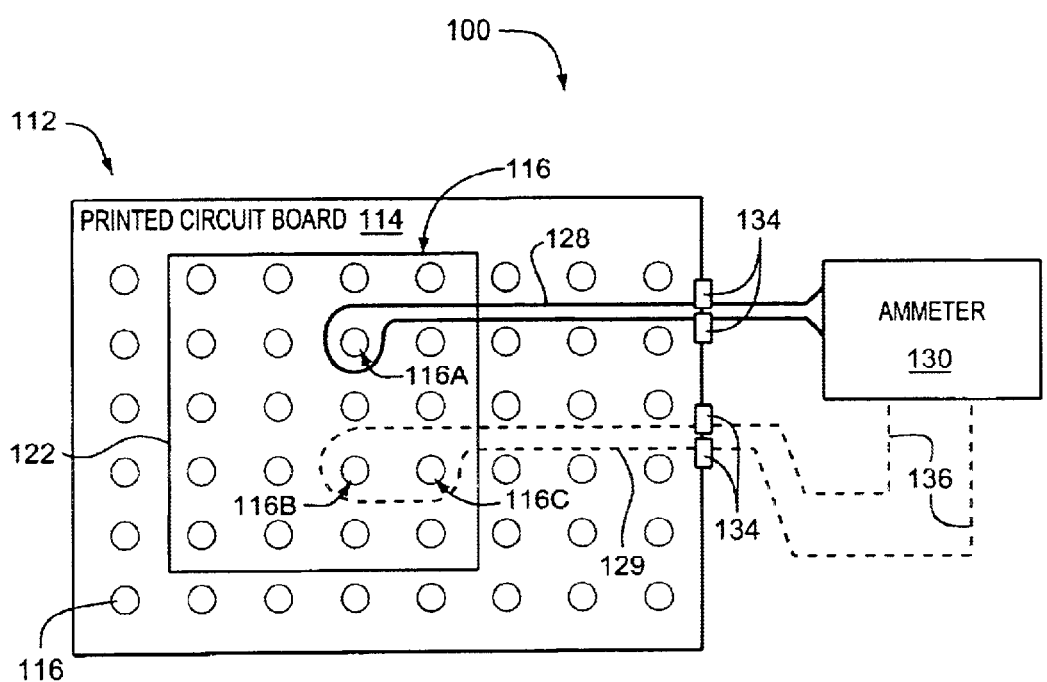
FIG. 5 shows a top view of one current estimation system of the invention.

FIG. 5 shows a top view of one current estimation device 100 of the invention, illustrating that such a device may monitor or sample—in circuit or parallel—multiple vias simultaneously. Specifically, device 100 couples with an electronic system 112 including a printed circuit board 114. Printed circuit board 114 has a plurality of vias 116. Certain vias 116 connect to a ground plane, e.g., ground plane 21 of FIG. 2. Certain other vias 116 connect to a power plane, e.g., power plane 20, FIG. 1; the power source may also connect to the power plane, ground plane and/or system ground, as in FIG. 2. A power component 122 (shown as a transparent outline in FIG. 5, for purposes of illustration) couples with printed circuit board 114 and operates by obtaining power and ground through vias 116. By way of example, power component 122 may be a semiconductor die and package attached to circuit board 114 by conductive solder joints or sockets, e.g., joints 24 of FIG. 2.

Device 100 also includes one or more electrically conductive loops 128, 129 that surround, at least in part, at least one relevant via 116; for purposes of illustration, loop 128 is shown to surround via 116A while loop 129 is shown to surround multiple vias 116B and 116C. Loops 128, 129 may monitor or sample a single power component 122, as shown, or different components, as in FIG. 1. Loop 129 may for example surround more than two vias 116B, 116C, as a matter of design choice.

In operation, device 100 characterizes current behavior of component 122 by measuring the current through loop 128 and/or loop 129. By way of example, transient and/or steady-state current behavior of the associated vias 116A, 116B, 116C may be determined from the measured current. Voltage behavior may also be assessed. Accordingly, a meter 130 couples with loop 128 and/or loop 129 to assess current behavior. As electrically appropriate, loops 128, 129 may be combined in series or parallel. Current flow direction through vias 116 may further determine which loops 128, 129 or calculation is used for a particular component 122. Measured behavior may be converted to power dissipation by a conversion equation VI, for example.

As above, electrically conductive loops 128, 129 may be an external component, such as in FIGS. 3 and 4, or be embedded and internal with printed circuit board 114. Probe connections 134 may connect with electrical leads 136 to couple loops 128, 129 to meter 130, as a matter of design choice.

The invention thus attains the objects set forth above, among those apparent from the preceding description. Since certain changes may be made in the above methods and systems without departing from the scope of the invention, it is intended that all matter contained in the above description or shown in the accompanying drawing be interpreted as illustrative and not in a limiting sense. It is also to be understood that the following claims are to cover all generic and specific features of the invention described herein, and all statements of the scope of the invention which, as a matter of language, might be said to fall there between.

What is claimed is:

1. A method for determining current behavior of power components in an electronic system, comprising the steps of:

forming an electrically conductive loop with a first printed circuit board of the electronic system to surround, at least in part, an electrical via of the first printed circuit board;

connecting a power component to the via to connect the power component to one of power and ground; and measuring current from the conductive loop while powering the component within the system.

2. A method of claim 1, further comprising the step of determining power dissipation associated with the power component based on the current.

3. A method of claim 2, the step of determining power dissipation comprising assessing VI, where I is the current of the via and V is a voltage associated with the power.

4. A method of claim 2, further comprising the step of designing thermal dissipation capacity for the electronic system.

5. A method of claim 4, the step of designing comprising designing a heat sink.

6. A method of claim 1, further comprising the step of determining transient current behavior based on the measured current.

7. A method of claim 1, further comprising the step of determining steady-state current based on the measured current.

8. A method of claim 1, the step of connecting the power component comprising coupling a semiconductor package to the via.

9. A method of claim 1, the step of connecting the power component comprising coupling the component to either a ground plane or power plane of the printed circuit board.

10. A method of claim 1, the step of forming the electrically conductive loop comprising forming a track within the first printed circuit board.

11. A method of claim 1, the step of forming the electrically conductive loop comprising the steps of forming a track within a second printed circuit board, forming an electrical connection within the second printed circuit board to electrically couple with the via, and coupling the second printed circuit board between the first printed circuit board and the power component.

12. A test method for assessing current behavior of power components in an electronic system, comprising the steps of:

forming one or more electrically conductive loops with a first printed circuit board of the electronic system to surround, at least in part, a plurality of electrical vias of the first printed circuit board;

connecting one or more power components to the vias so as to connect the components to one or both of power and ground; and measuring currents from the conductive loops.

13. A method of claim 12, further comprising the step of determining a first current behavior associated with the power components, and based on the currents.

14. A method of claim 13, the step of forming comprising forming the loops about a statistical sampling of the vias, and further comprising determining a second current behavior of additional power components powered with the electronic system, and based on the first current behavior.

15. A method of claim 14, further comprising the step of defining a total power dissipation based on the first and second current behaviors.

16. A method of claim 15, further comprising designing thermal dissipation capacity for the electronic system based on the total power dissipation.

17. A method of claim 12, the step of forming comprising forming one or more tracks with internal layers of the first printed circuit board.

18. A method of claim 12, the step of forming comprising forming one or more tracks with a second printed circuit board, and further comprising the steps of forming one or more electrical connections with the loops and with the second printed circuit board, and coupling the second printed circuit board between the first printed circuit board and the power components such that the power components obtain power from the system and through the connections.

19. A method of claim 12, the step of connecting one or more power components comprising coupling one or more semiconductor packages to ground and power planes of the first printed circuit board.

20. A method of claim 12, further comprising the step of assessing transient current behaviors of the components based on the measured currents.

21. A method of claim 12, further comprising the step of assessing steady-state current behaviors of the components based on the measured currents.

22. A method of claim 12, the step of forming comprising forming at least one conductive loop about multiple vias.

23. A power estimation system, comprising at least one electrically conductive loop with a first printed circuit board, the first printed circuit board forming an electrical connection through the loop and between a power component and a second printed circuit board, and a meter for measuring current through the loop when the power component is powered through the second printed circuit board.

* * * * *